United States Patent

[11] 3,634,854

[72] Inventor Wilmer C. Anderson
Stamford, Conn.

[21] Appl. No. 797,521
[22] Filed Feb. 7, 1969
[45] Patented Jan. 11, 1972
[73] Assignee General Time Corporation
Stamford, Conn.

[54] ANALOG-TO-DIGITAL CONVERTER
8 Claims, 10 Drawing Figs.

[52] U.S. Cl. 340/347 AD
[51] Int. Cl. H03k 13/02
[50] Field of Search 332/12; 340/347

[56] References Cited

UNITED STATES PATENTS

| | | | |
|---|---|---|---|
| 3,139,595 | 6/1964 | Barber | 332/12 |
| 3,275,949 | 9/1966 | Johnson | 332/12 |
| 3,426,296 | 2/1969 | Christensen | 340/347 |
| 3,349,390 | 10/1967 | Glassman | 340/347 |
| 3,502,975 | 3/1970 | Gowan | 340/347 |
| 3,359,552 | 12/1967 | Holt, Jr. | 340/347 |
| 3,384,838 | 5/1968 | Knutrud | 332/12 |
| 3,435,249 | 3/1969 | Farrell | 332/12 |
| 3,487,299 | 12/1969 | Hart | 332/12 |

*Primary Examiner*—Thomas A. Robinson
*Assistant Examiner*—Jeremiah Glassman
*Attorney*—Pennie, Edmonds, Morton, Taylor & Adams

ABSTRACT: An analog-to-digital conversion system in which a pulse width modulator is provided for producing a primary pulse having a width representative of a variable and in which the variable width pulse is used to gate a stream of higher frequency pulses from an auxiliary oscillator to a multistage binary counter. This auxiliary oscillator is disconnected at the completion of the primary pulse, and the binary coded number, stored in the counter, is read out, stage by stage, onto an output line. Upon completion of readout the count in the binary counter is set to zero in readiness for reconnection to the auxiliary oscillator upon receipt of the next variable width primary pulse of first polarity. In one of the aspects of the invention an improved pulse width modulator is provided in the form of a free-running oscillator having a symmetrical circuit including a saturable core reactor with windings for driving the core alternately to saturation in opposite directions and in which a modulation winding is subjected to variable modulating current from a transducer so that pulses of first polarity are produced having a pulse width which depends upon the condition of the transducer.

INVENTOR
WILMER C. ANDERSON
by: Wolfe, Hubbard, Voit & Osann
ATTYS.

INVENTOR
WILMER C. ANDERSON by: Wolfe, Hubbard, Voit & Osann
ATTYS.

ANALOG-TO-DIGITAL CONVERTER

It is an object of the invention to provide an analog-to-digital conversion system to obtain for a variable input condition a digital representation which is highly reliable and capable of resolution to one part in a thousand or better.

It is another object of the invention to provide an analog-to-digital conversion system which provides a relatively high sampling rate, on the order of one reading per second, and which provides a binary coded readout, making the system particularly well suited for monitoring a rapidly changing condition or for telemetering in the face of high-level background noise.

It is a general object to provide an analog-to-digital conversion system which is nonetheless simple, inexpensive, highly compact, and capable of operation with only small amounts of electrical power, making it well suited for telemetering in oceanic or space probes or the like where a high interference level may be encountered, and particularly where the apparatus must be expendable.

In one of the aspects of the invention it is an object to provide, as a subassembly of an analog to digital conversion system or the like, a novel pulse width modulator in which a variable input, sensed by a suitable transducer, is converted to a pulse of variable width having a periodic rate sufficiently high to provide frequent samplings of a rapidly changing input condition.

It is a related object to provide a pulse width modulator of simple and highly compact construction which permits variation of pulse width over wide limits, from near zero to almost the length of an entire sampling period. It is another related object to provide a pulse width modulator in which the pulse width varies in near-linear proportion to the input signal.

Other objects and advantages of the invention will become apparent upon reading the attached detailed description and upon reference to the drawing in which.

Figures 1, 2, 3A, 3B, 3C:
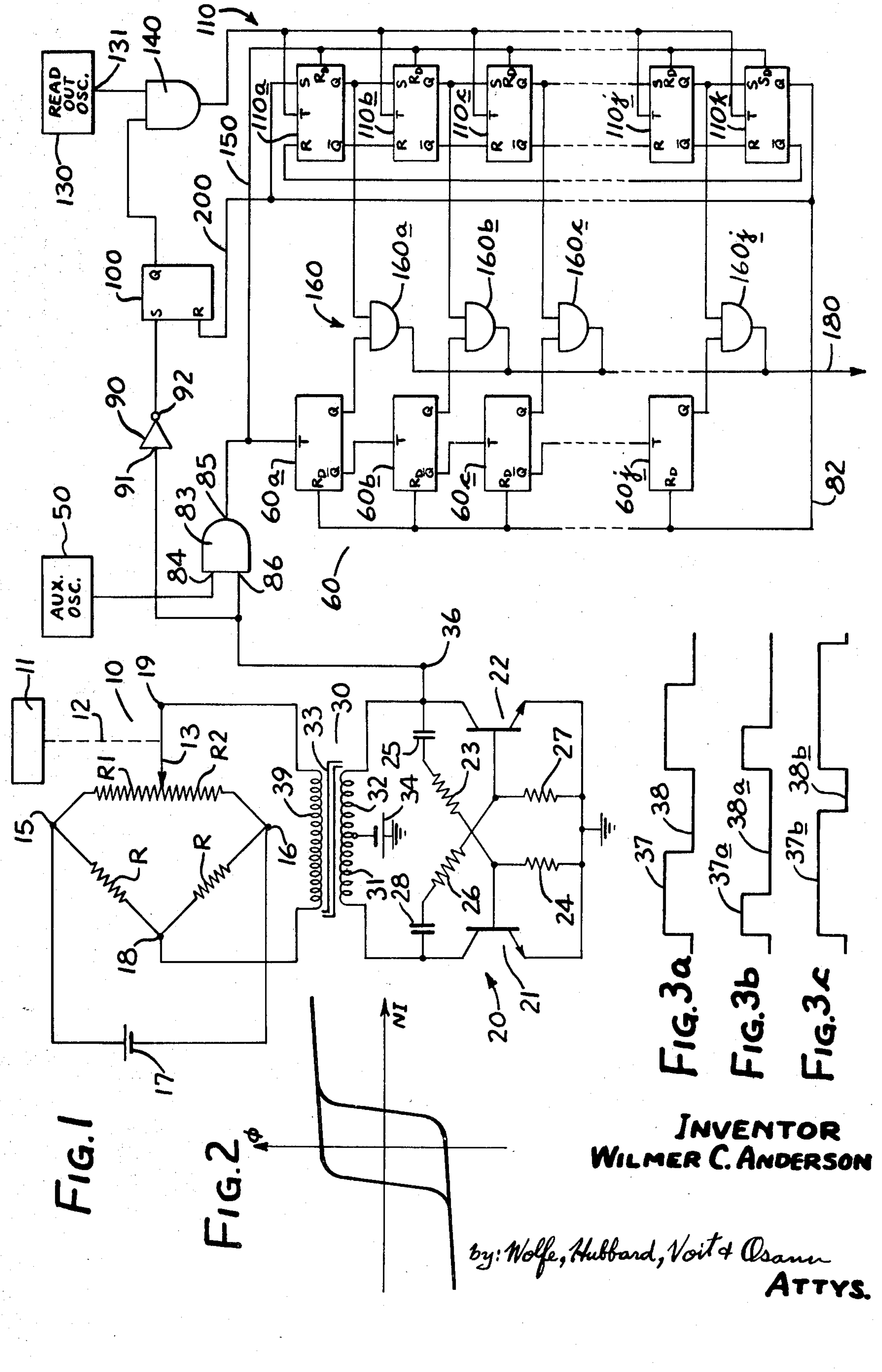
FIG. 1 is a diagram of an analog-to-digital conversion system constructed in accordance with the present invention.
FIG. 2 is a graph of a hysteresis loop for the saturable core.
Figure 4:
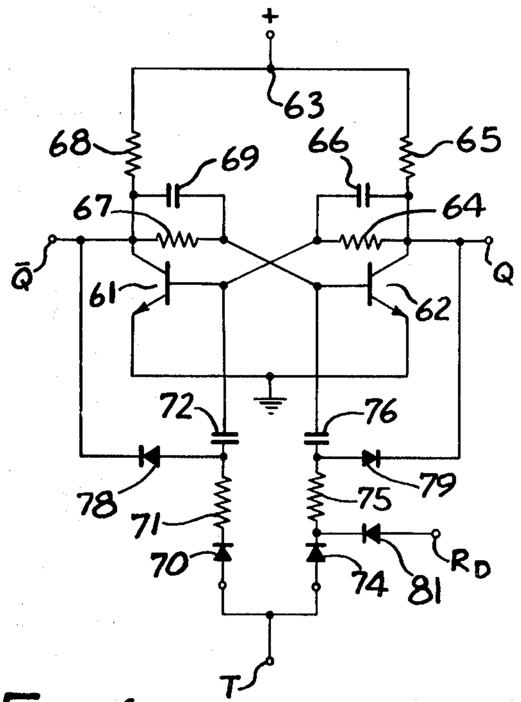
Figure 5:
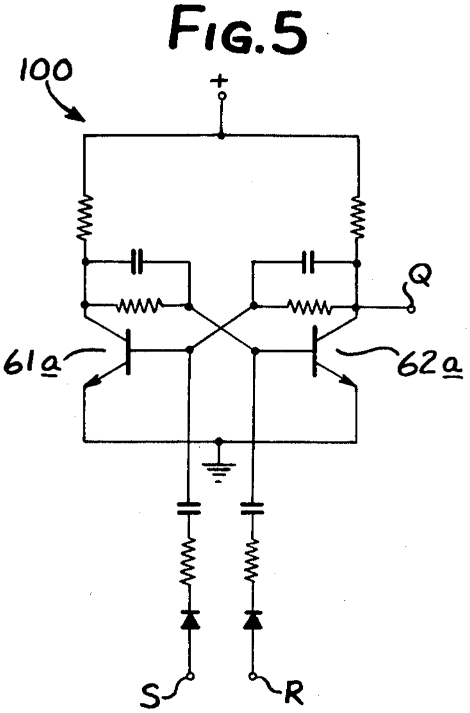
Figure 6:
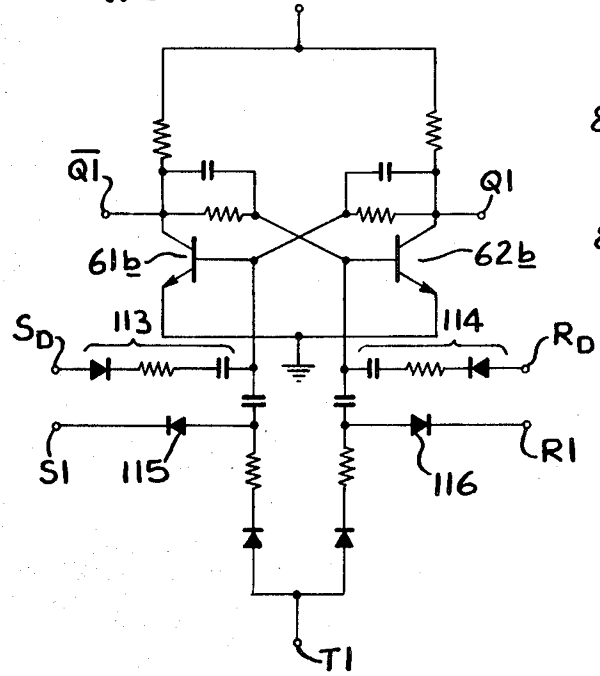
Figure 7:
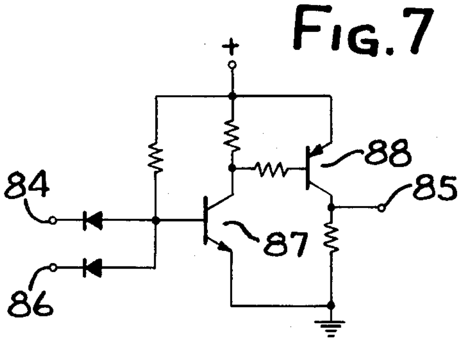
Figure 8:
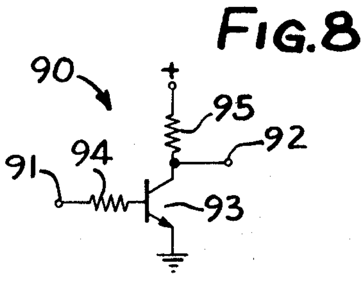

FIGS. 3*a*–3*c* show a plot of the output of the pulse width modulator portion of FIG. 1 for three different transducer conditions;

FIGS. 4–6 show circuit diagrams of typical flip-flop devices which can be employed in the circuit of FIG. 1;

FIG. 7 shows a typical AND-gate circuit for use in the circuit of FIG. 1; and,

FIG. 8 shows an inverter circuit used in FIG. 1.

While the invention has been described in connection with a preferred embodiment, we do not intend to limit the invention to the form set forth, but, on the contrary, we intend to cover such alternatives, modifications and equivalents as may be included within the spirit and scope of the invention.

Turning now to FIG. 1, there is disclosed a transducer 10 for producing an electrical output in accordance with a condition to be measured. The transducer includes a pickup unit 11 having an associated variable resistance element. In the present instance the pickup unit is coupled by means of a mechanical connection 12 to a slider 13 of a potentiometer, the two legs of the potentiometer being indicated as R1 and R2 respectively. The potentiometer preferably forms one side of a bridge circuit, with the legs designated R forming the remaining side. The input terminals 15 and 16 of the bridge are connected to a suitable direct current source 17 of constant voltage. A DC potential difference thus appears across the bridge output terminals 18 and 19, the magnitude and direction of this voltage being dependent upon the condition of the input pickup unit 11 and the corresponding setting of the potentiometer slider 13. The pickup device 11, may, for example, be in the form of a pressure- or temperature-responsive device mechanically connected to the potentiometer or, if desired, the two variable resistance legs R1 and R2 may be integrated into the pickup. The latter technique allows for the incorporation of strain gauges or like devices which convert input variations into resistance variations.

The term "transducer" as used herein shall be understood to be employed in the general sense of a device which produces an output signal, in terms of current or voltage, which varies in accordance with a condition including the condition of manual setting of a control element.

For the purpose of responding to the output of the transducer circuit, a free-running oscillator 20 is provided having a balanced circuit including first and second transistors 21, 22. The input of the transistor 21 is supplied from a voltage divider consisting of resistors 23, 24 in series with a capacitor 25 bridged across the output of the second transistor 22. The input of transistor 22 is similarly supplied from a voltage divider consisting of resistors 26 and 27 and series capacitor 28 bridged across the output of the transistor 21. Connected in series with the output circuits of the respective transistors is a saturable reactor 30 having saturating windings 31 and 32, respectively wound upon a core 33. The DC voltage source 34 for the oscillator is connected at the junction of windings 31 and 32, providing ample saturating current for the core.

In operation, one side of the symmetrical circuit will initially conduct slightly more than the other due to normal differences in the characteristics of the two transistors. The difference between the currents in saturating windings 31 and 32 produces a net magnetizing force in the core, inducing in the windings a voltage of such polarity as to increase the current in the transistor with the larger initial current and decrease the current in the second transistor. This process is cumulative and continuous until the first transistor carries sufficient current to drive the core to saturation in one direction. When the core saturates, the impedance of the saturating winding and the induced voltage in the second winding both diminish rapidly. The resulting decrease in conduction of the first transistor is reflected in a reversal of voltage at the input of the second transistor, causing it to conduct increasingly, which in turn tends to reduce the drive to the first transistor at an even faster rate. As a result, a voltage is induced which operates regeneratively on the input to the second transistor, causing it to conduct increasingly. When the core saturates in the opposite direction, the first transistor will start to conduct again. This cycle is endlessly repeated at a constant rate which is dependent upon the time constant of the resistor-capacitor input circuitry and the voltage-time product needed to saturate the core 33. A "square" output wave is produced at the output terminals of both transistors. For purposes of description, only the waveform at terminal 36 will be discussed. As long as symmetry is maintained, the adjacent half waves, 37 and 38 in FIG. 3*a*, will be of equal width.

IN accordance with one of the aspects of the present invention, the saturable core 33 is provided with a biasing, or modulating, winding 39 which is connected to the output terminals 18 and 19 of the transducer bridge circuit. A voltage across the biasing winding 39 produces a biasing flux in the core which modifies the operation of the oscillator by effectively shifting the saturation points. In short, because of the biasing flux, saturation is achieved more quickly in one direction and more slowly in the other direction, the direction of the shift depending upon the polarity of the bias. However, the two changes are complementary; hence the period and frequency of the oscillator remain unchanged. The core and its windings can also be viewed as a transformer. The transducer output voltage across winding 39 is transformed to the saturating windings 31 and 32, the transformed voltage adding to the saturating voltage in one direction and subtracting from the saturating voltage in the other direction, resulting in nonsymmetrical operation of the oscillator.

The resistances in the bridge transducer circuit may be chosen such that a zero reference condition of the slider 13 results in a null voltage, or zero potential difference, across the output terminals 18 and 19. With no voltage across the biasing winding 39, the output 36 of the oscillator will be symmetrical, as indicated in FIG. 3*a*. When the slider 13 is moved to one side of the zero reference point, the wave of first polarity 37 is shortened, as indicated at **37*a*** in FIG. 3*b*, while the wave of second, or opposite, polarity is lengthened as indicated at 38*a*. When the slider 13 is moved to the other side of the reference point, the opposite effect occurs, with the half wave of first polarity being lengthened as shown at 37*b* in FIG. 3*c* and the half wave of second polarity being shortened as indicated at 38*b*. The effect is to produce a wide range of variation in the width of the pulse of first polarity, a width which can vary from near zero to almost the total period of oscillation.

It is found using the above pulse width modulator arrangement that the pulse width at the output terminal 36 varies in proportion to the transducer output voltage. The transducer output can be made more or less linear with respect to the variation at the transducer input by employing a potentiometer of appropriate taper or by using a transducer having a nonlinear output to compensate for the inherent nonlinearity of the bridge, thereby to produce a pulse which varies in close proportion to the condition being measured. This compensation, if needed, is well within the scope of one skilled in this art.

In accordance with another aspect of the present invention, an auxiliary source of pulses is provided having a constant frequency, or repetition rate, which is much greater than the frequency of the modulator oscillator along with a binary counter to count the pulses from the auxiliary source, which pulses are fed into the counter only while the output of the pulse width modulator is of first polarity, so that the counter registers a binary coded count which is accurately representative of the condition at the transducer input. Moreover, reading means are provided in the form of a commutating ring, or a ring counter, with suitable gating, so that the stages of the binary counter are effectively sampled in sequence to produce a series of pulses on an output line, such pulses being a serial version of the count in the binary counter. The commutating ring is activated upon receipt of a pulse of second polarity, and when the readout, or sampling cycle, is completed, the ring is deactivated and the count in the binary counter is restored to zero in readiness for reconnection to the auxiliary oscillator upon receipt of the next pulse of first polarity.

Thus, referring to FIG. 1, an auxiliary oscillator 50 is provided coupled to a binary counter 60 having stages 60*a*...60*j*. The oscillator may be of any desired design producing a square wave output having a constant frequency much higher than the frequency of the modulator oscillator 20. The actual frequency of the auxiliary oscillator 50, for optimum resolution, is preferably chosen so that the maximum count obtainable in the binary counter 60 will correspond to the maximum width of the modulator output pulse. For a modulator frequency of 1 Hz., the width of the modulator output pulse of first polarity may approach 1 second. Assuming use of an auxiliary oscillator 50 having a frequency of 1 kHz., it is evident that 1000 pulses will be fed to the binary counter 60 during the 1 second interval. A 10-stage binary counter having a capacity of $2^{10}$, or 1,024, is therefore used.

For the purpose of enabling the pulses from the auxiliary oscillator 50 to be fed to the counter 60, an AND-gate 83 is provided, having an input terminal 84, an output terminal 85 and a control terminal 86. The control terminal 86 is connected to the output terminal 36 of the pulse width modulator so that the counter is fed only while the modulator output is of first polarity. A typical circuit for this gate, as shown in FIG. 7, includes two cascaded transistor inverting stages 87, 88, neither of which will conduct until both the input and control terminals 84, 86 are high in voltage, at which time the voltage at the output terminal 85 will go high.

Each of the stages 60*a*, 60*b*...60*j*, of the binary counter 60 may have a circuit such as that shown in FIG. 4. In this Figure a simple binary storage unit, commonly called a flip-flop, is shown, having an input terminal T, first and second output terminals Q and $\overline{Q}$, and direct reset terminal $R_D$. The circuit includes first and second transistors 61, 62, the input of the first transistor 61 being connected to a voltage source 63 by way of first and second resistors 64, 65 and a shunting capacitor 66 while the input of the second transistor 62 is connected to the source 63 by way of third and fourth resistors 67, 68 and a shunting capacitor 69. The circuit constants are chosen so that the first transistor 61 is biased to saturation when the second transistor 62 is at cutoff, and vice versa. The result is that the circuit has two possible states; a ONE state, evidenced by a high voltage at the Q output and a low voltage at the $\overline{Q}$ output, and a ZERO state, evidenced by a low voltage at the Q output and a high voltage at the $\overline{Q}$ output. In the present instance it is intended to have a circuit change state on the leading edge of every positive pulse at the input terminal T. For this reason the first transistor 61 is connected to T through a directional diode 70, a resistor 71, and a differentiating capacitor 72. In similar fashion, the second transistor 62 is connected to T through a second diode-resistor-capacitor combination 74, 75, 76 respectively. A blocking diode 78 is provided which effectively prevents the input pulse at T from affecting the first transistor 61 when that transistor is already conducting. A second blocking diode 79 performs the same function for the second transistor 62.

To understand the operation of this circuit, assume first that the circuit is in the ZERO state and that the second transistor 62 is saturated. A positive pulse at T will cause current to flow toward the inputs of both transistors, but the current flowing toward the second transistor will be shunted to ground through the blocking diode 79 and the saturated collector-emitter junction of the second transistor 62. The signal going toward the first transistor 61 will be differentiated by the capacitor 72 to produce a current spike of sufficient magnitude to initiate conduction in the first transistor 61. The resulting voltage drop at the collector of this transistor 61 will be conveyed to the input of the second transistor 62 by the capacitor 69 to cause a sharp drop in the current flow therein, which in turn allows a regenerative current to flow through resistors 64, 65 to bias the first transistor to saturation. The result is an abrupt change to the ONE state, as indicated by a step rise in voltage at the output Q. The next positive pulse at T will be shunted away from the first transistor 61 through blocking diode 78 and the now-saturated collector-emitter junction of the first transistor 61. This signal will now flow freely toward the second transistor 62, being differentiated by the capacitor 76 to produce a current spike of sufficient magnitude to initiate conduction in the second transistor 62. The resulting collector voltage drop at Q, coupled through the capacitor 66, will reverse bias the first transistor, allowing a regenerative current to flow through resistors 67 and 68 to bias the second transistor 62 back into saturation. The result is a change back to the ZERO state, as evidenced by an abrupt voltage drop at the output Q. Thus the circuit is seen to change state on the leading edge of every positive pulse at T. The $R_D$ terminal is connected to the input of the second transistor 62 through a directional diode 81 via resistor 75 and the differentiating capacitor 76, providing a means by which the stage may be set to the ZERO state before any pulses arrive at T. Since all $R_D$ terminals in the counter are tied to a single line 82, the entire counter may be reset to the ZERO state by a single positive pulse.

Once the counter has been reset to ZERO, the count operation may be described as a function of the pulses being gated from the auxiliary oscillator 50. The first positive pulse causes the first stage 60*a* to go to the ONE state while the other stages remain in the ZERO state. The second pulse triggers the first stage back to the ZERO state, producing an abrupt voltage rise at its $\overline{Q}$ output, which causes the second stage 60*b* to go the ONE state. The second stage 60*b* will be triggered back to the ZERO state on the fourth pulse, causing the THIRD stage 60*c* to go to the ONE state. In a similar manner, each succeeding stage is activated as the number of input pulses reaches higher powers of 2. Thus each stage can be seen to represent a binary value, or weight, so that the first stage 60*a* has a weight of 1, the second stage 60*b* has a weight of 2, the third stage 60*c* has a weight of 4, the fourth stage 60*d* has a weight of 8, etc. When the input pulses stop, one can readily determine the number of pulses which have come into the counter 60 by adding the weights of those stages which are in the ONE state. Thus, if, when beginning at the first stage 60a, the stages are observed to be in states ONE, ZERO, ONE, ONE, ZERO and ONE respectively, the total registered in these first six stages would be 1+4+8+32, or 45. This coding method is used extensively in the art and is designated binary-coded-decimal, or BCD.

Another aspect of the present invention calls for readout of the count accumulated in the counter so that it appears as a series of pulses, in BCD code, on a single output line. For this purpose a commutating ring 110 is provided, having stages 110a, 110b...110j, which are respectively associated with the stages of the counter 60. For activating the ring, control circuitry is provided, including an inverter 90, a control flip-flop 100, a readout oscillator 130, and an AND-gate 140. The ring also has a stage 110k.

The inverter 90, having an input terminal 91 and an output terminal 92, may be of the type shown in FIG. 8. This figure depicts a single transistor inverting stage 93 with an input resistor 94 and a collector dropping resistor 95. A negative pulse at the input 91 results in a positive pulse at the output 92 and vice versa.

Typical circuitry which may be used in the flip-flop 100 is shown in FIG. 5. This circuit is similar to that shown in FIG. 4 in that it contains first and second transistors 61a, 62a with inputs and outputs of each respectively coupled to the outputs and inputs of the other. The circuit also has separate input terminals S and R as well as an output terminal Q. Simply stated, a pulse of first polarity at the S terminal will cause the first transistor 61a to conduct, and the circuit will go to the ONE state as described for the similar circuit in FIG. 4. To cause the circuit to shift back to the ZERO state a pulse of first polarity must be applied at the R terminal. Connected in the circuit shown in FIG. 1, this circuit will be seen to go to the ONE state when the output of the modulator oscillator goes to second polarity and back to the ZERO state at the completion of a full cycle of the commutating ring as will be hereinafter shown.

The readout oscillator 130 having an output terminal 131 may be of any type producing a square wave output. The pulses at the output terminal 131 are gated to the ring by way of the AND-gate 140 which may have the same circuit as the gate 83 previously described.

The commutating ring 110 having stages 110a, 110b...110k operates such that only one of the stages is in the ONE state at a time, this ONE state being shifted from stage to stage in succession upon the occurrence of each pulse being gated from the readout oscillator 130. Thus each stage in succession will provide an output pulse of first polarity until the final stage 110k receives the ONE condition, at which time the control flip-flop 100 is reset by a positive pulse at its R terminal, resulting in a low voltage at its output terminal Q which effectively disables the oscillator pulse gate 140. This leaves the ONE condition existing at the output of the last stage 110k and the input of the first stage 110a in readiness for the next second polarity pulse at the output terminal 36 of the modulator 20.

Typical circuitry for the flip-flops used in the commutating ring 110 is shown in FIG. 6. This circuit, having input terminals S1 and R1, a toggle terminal T1, direct set and reset terminals $S_D$ and $R_D$ and complementary output terminals Q1 and $\bar{Q}1$, is similar to the two flip-flops previously described in that it has first and second transistors 61b, and 62b which have cross-coupled input and output circuits. The ONE and ZERO states are as previously described for the other flip-flops. The $S_D$ and $R_D$ terminals are connected to the first and second transistors 61b and 62b through independent input circuits 113 and 114 respectively. The S1 and R1 terminals are connected through a pair of blocking diodes 115 and 116 respectively inserted in the input circuits to the first and second transistors 61b, 62b. If the R1 terminal is at a low voltage, the diode 116 blocks the pulse applied to the toggle terminal T1 from the input of the second transistor 62b. If at the same time the S1 terminal is at a high voltage, the pulse at T1 will be coupled to the input of the first transistor 61b, thereby driving the circuit to the ONE state. In a similar manner, if the S1 terminal is low in voltage and the R1 terminal is high, the pulse at T1 will be shunted away from the first transistor 61b through the diode 115 but will reach the second transistor 62b to drive the circuit to the ZERO state. Thus it is seen that the voltages at the inputs S1 and R1 will be shifted to the outputs Q1 and $\bar{Q}1$ respectively at the occurrence of a positive pulse at T1. Speaking in terms of the commutating ring 110, this means that the state of each stage will be effectively shifted to the next succeeding stage at the occurrence of each pulse gated from the readout oscillator 130.

Still referring to the circuit in FIG. 6, it is seen that the $S_D$ and $R_D$ terminals coupled to the first and second transistors 61b and 62b respectively provide a means independent of T1 for setting the circuit to the ONE state or the ZERO state. For the purpose of properly setting the ring, a reset line 150 is provided which runs to the $R_D$ terminal of stages 110a through 110j and to the $S_D$ terminal of stage 110k. Upon occurrence of a positive pulse on this line 150 the entire ring is set to ZERO save for the last stage, which is set to the ONE state. Since the ring must be properly set before the readout begins, the reset line 150 is tied to the output terminal 85 of the AND-gate 83, and is thus actuated by the pulse of first polarity from the modulator oscillator 20.

For the purpose of reading, or sampling, the contents of the binary counter 60, a series of AND-gates 160 connected to a common output line 180 are interposed between the stages of the commutating ring 110 and the respective stages of the binary counter 60. A high voltage will appear on the output line 180 while stage 110a of the ring 110 is in the ONE state if the corresponding counter stage 60a is also in the ONE state. Likewise, a high voltage will appear on the readout line 180 while 110b of the ring 110 is the ONE state only if its corresponding counter stage 60b is also in the ONE state; and so on through the last stage 60j of the counter 60, the cumulative result being that, as the ring circulates, the contents of the successive counter stages are effectively shifted to the output line 180. The serial pulse train produced will contain the same binary number which was stored in the counter 60, the output frequency being that of the readout oscillator 130.

The AND-gates 160a, 160b...160j may be of the same type as gate 83 and gate 140 previously described and represented by the circuit in FIG. 7.

The commutating ring 110 has one more stage than the counter 60. When the ONE condition reaches this last stage 110k of the ring, the readout has been completed, and the binary counter 60 is reset to ZERO by a positive pulse on the reset line 82. The control flip-flop 100 is also reset at this time by way of a connection 200 to the R input. This puts the Q output of the flip-flop 100 at a low voltage, thereby disabling the gate 140 and stopping the commutating ring 110.

Since the readout process begins when the modulator output 36 goes to second polarity, the frequency of the readout oscillator must be high enough to insure that the commutating ring 110 has completed its cycle and reset the binary counter 60 to ZERO before the modulator output 36 goes to first polarity again.

I claim as my invention:

1. In an analog-to-digital conversion system, the combination comprising, a transducer producing a variable output voltage, a free-running oscillator having a saturable core reactor with windings for driving the core to saturation alternately in opposite directions, a biasing winding on the core connected to the transducer for biasing the core to produce an output signal in the form of pulses of first and second polarity having a relative length which depends upon the condition of the transducer, an auxiliary oscillator having a frequency which is of higher order of magnitude than the frequency of the pulses from the source, a binary counter unit, means including a gate responsive to a pulse of first polarity for connecting the free-running oscillator to the counter unit for storing a binary coded count representative of the length of the pulse of first polarity, an output line, reading means for connecting the binary counter unit to the output line for serial readout of the binary coded count stored in the counter unit, means responsive to a pulse of second polarity for disconnecting the auxiliary oscillator and for turning on the reading means, and means responsive to the completion of readout for turning off the reading means and for restoring the count in the binary counter unit to zero in readiness for reconnection to the auxiliary oscillator upon receipt of the next pulse of first priority.

2. The combination as claimed in claim 1 in which the frequency of the auxiliary oscillator is greater than the frequency of the free-running oscillator by two to approximately three magnitudes.

3. In an analog-to-digital conversion system, the combination comprising a source of periodic control pulses of alternating first and second polarity in which the length of a pulse of first polarity constitutes a measure of a variable, an auxiliary oscillator having a frequency which is higher by order of magnitude than the frequency of the pulses, a binary counter unit in the form of series-connected flip-flops, one for each binary order, means including a gate responsive to pulses of first polarity for connecting the auxiliary oscillator to the counter unit for storing a binary coded count representative of the width of a pulse of first polarity, an output line, reading means for coupling the flip-flops to the output line in sequence for producing successive pulses on said line representative of the binary coded count stored in said flip-flops, means responsive to a pulse of second polarity at said source for turning on the reading means, and means responsive to the reading of the last flip-flop in the series for turning off the reading means and for restoring the count in the flip-flops to zero in readiness for reconnection to the auxiliary oscillator upon receipt of the next control pulse of first polarity.

4. The combination as claimed in claim 3 in which the frequency of the auxiliary oscillator is on the order of 1000 times the frequency of the pulses from the source.

5. In an analog-to-digital conversion system, the combination comprising a source of periodic control pulses of alternating first and second polarity in which the length of a pulse of first polarity constitutes a measure of a variable, an auxiliary oscillator having a frequency which is higher by order of magnitude than the frequency of the pulses from the source, a binary counter unit in the form of series connected flip-flops, one for each binary order, means including a gate responsive to pulses of first polarity for connecting the source to the counter unit for storing a binary coded count representative of the length of a pulse of first polarity, an output line, a ring counter in the form of a ring of commutating flip-flops respectively coupled to the flip-flops in the counter unit, a commutating oscillator having a frequency which is lower tan that of the auxiliary oscillator for commutating the ring so that the flip-flops in the counter unit are successively connected to the output line to produce readout of a series of pulses on said line representative of the binary count stored in said counter unit, means responsive to the completion of readout for disconnecting the commutating oscillator from the ring counter and for restoring the count in the flip-flops of the binary counter unit to zero in readiness for reconnection of the storage unit to the auxiliary oscillator upon receipt of the next control pulse of first polarity.

6. The combination as claimed in claim 5 in which the frequency of the auxiliary oscillator is on the order of a thousand times the frequency of the pulses from said source and in which the frequency of the commutating oscillator is a small fraction of the frequency of the auxiliary oscillator.

7. In an analog-to-digital conversion system, the combination comprising a transducer having a variable resistance, a free-running oscillator having a symmetrical circuit including a saturable core reactor with windings for alternate saturation of the core in opposite directions for producing half-wave output pulses of alternating first and second polarity, a biasing winding on the core coupled to the transducer and source of current for effective complementary shifting of the points of saturation thereby to change the relative length of the output pulses, an auxiliary oscillator having a frequency which is higher by order of magnitude compared to the frequency of the pulses from the free-running oscillator, a binary counter unit in the form of series connected stages, one for each order, means including a gate responsive to a pulse of first polarity for connecting the auxiliary oscillator to the counter unit for storing a binary coded count representative of the length of the pulse of first polarity, an output line, reading means including a commutating ring for connecting the stages of the counter unit to the output line in sequence for producing a succession of pulses on said line representative, order by order, of the binary coded count stored in said stages, means responsive to a pulse of second polarity from said source for turning on the reading means, and means responsive to completion of the cycle of the commutating ring for turning off the reading means and for restoring the count in the counter unit to zero in readiness for reconnection to the oscillator upon receipt of the next pulse of first polarity.

8. In an analog-to-digital conversion system, the combination comprising a transducer having a variable resistance, a free-running oscillator including first and second transistors and a saturable core reactor having windings respectively energized by the transistors, the transistors having cross-coupled input and output circuits for alternately driving the core to saturation in opposite directions to produce periodic half waves of output signal, a biasing winding on said core coupled to the transducer and source of current for effectively shifting the points of saturation to thereby change the relative length of the output pulses, an auxiliary source of high-frequency pulses having a constant repetition rate which is approximately two to three magnitudes greater than that of the pulses of the free-running oscillator, a binary counter, means including a gate interposed between the auxiliary source and the counter for connecting the auxiliary source to the counter for the duration of a pulse of first polarity from said oscillator and for disconnecting the auxiliary source from said counter for the duration of a pulse of second polarity so that a count is registered in said counter which is an accurate measure of the condition of said transducer.

* * * * *